United States Patent
Terada et al.

(10) Patent No.: US 10,886,838 B2
(45) Date of Patent: Jan. 5, 2021

(54) SEMICONDUCTOR INTEGRATED CIRCUIT FOR DISCHARGING AND POWER SUPPLY SYSTEM

(71) Applicants: Chuhei Terada, Isehara (JP); Yoichi Takano, Hadano (JP)

(72) Inventors: Chuhei Terada, Isehara (JP); Yoichi Takano, Hadano (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/442,179

(22) Filed: Jun. 14, 2019

(65) Prior Publication Data

US 2019/0393773 A1 Dec. 26, 2019

(30) Foreign Application Priority Data

Jun. 26, 2018 (JP) ................................. 2018-120708

(51) Int. Cl.
*H02M 1/32* (2007.01)
*H03K 17/284* (2006.01)
*H01L 27/118* (2006.01)

(52) U.S. Cl.
CPC ......... *H02M 1/32* (2013.01); *H01L 27/11898* (2013.01); *H03K 17/284* (2013.01); *H02M 2001/322* (2013.01)

(58) Field of Classification Search
CPC H02M 1/32; H02M 2001/322; H03K 17/284; H03K 17/122; H03K 17/16; H01L 27/11898; G05F 1/561
See application file for complete search history.

(56) References Cited

U.S. PATENT DOCUMENTS

| 6,414,537 | B1 | 7/2002 | Smith | |
|---|---|---|---|---|
| 2011/0123033 | A1* | 5/2011 | Wu | H04R 5/04 381/28 |
| 2013/0002220 | A1* | 1/2013 | Terada | G05F 1/56 323/282 |
| 2016/0118977 | A1* | 4/2016 | Yi | H03K 19/018521 323/271 |
| 2019/0173464 | A1* | 6/2019 | Lin | H03K 17/687 |

* cited by examiner

*Primary Examiner* — Jue Zhang
*Assistant Examiner* — Trinh Q Dang
(74) *Attorney, Agent, or Firm* — Holtz, Holtz & Volek PC

(57) ABSTRACT

Disclosed is a semiconductor integrated circuit for discharging, which includes: a plurality of discharging elements; a plurality of external terminals connected respectively to first terminals of the plurality of discharging elements; and a controlling external terminal which is capable of receiving from an outside a signal indicating that an operation of an internal circuit is enabled/disabled. In response to the signal received at the controlling external terminal or an output signal of a logic circuit that receives the signal being applied to controlling terminals of the plurality of discharging elements, the discharging semiconductor integrated circuit turns on the plurality of discharging elements to draw charges respectively through the plurality of external terminals.

9 Claims, 7 Drawing Sheets

SEMICONDUCTOR INTEGRATED CIRCUIT FOR DISCHARGING AND POWER SUPPLY SYSTEM

CROSS-REFERENCE TO RELATED APPLICATION

This application is based upon and claims the benefit of priority under 35 USC 119 of Japanese Patent Application No. 2018-120708 filed on Jun. 26, 2018, the entire disclosure of which, including the description, claims, drawings and abstract, is incorporated herein by reference in its entirety.

BACKGROUND

Technical Field

The present invention relates to a semiconductor integrated circuit for discharging that includes a discharging element, in particular a semiconductor integrated circuit for discharging that can form two or more discharging pathways and regulate a discharge time, and to a power supply system.

Background Art

Some devices that require two or more power supplies, such as CPUs (microprocessors), SoCs (systems on chip) and system LSIs, have a specific on/off-sequence. For example, when a CPU uses two power supplies (regulators) respectively for its I/O and core, the potential of the two power supplies is typically controlled to have a relationship of I/O power supply>core power supply. In such devices and systems, reversal of the potential relationship between the I/O power supply and the core power supply may turn on a parasite element in the CPU of the core to break the IC. To avoid this, it is necessary to impose a limitation to the on/off-sequence of devices that use two or more power supplies.

To control the on/off-sequence of such devices and systems, discreet components (an inverter, an FET, a resistor, etc.) are used to form a discharging circuit as illustrated in FIG. 4(B), which is configured to discharge the core power supply first and thereafter the I/O power supply when the power supplies are stopped (regulators are turned off).

For example, an invention relating to a reference voltage supply circuit with a discharging circuit is disclosed in U.S. Pat. No. 6,414,537B. According to the invention, a discharging FET is turned on by using a control signal EN to discharge residual charges in an output capacitor of the reference voltage supply so that the output voltage rapidly falls.

A problem with a discharging circuit composed of discreet components is that it requires two control signals (EN 1, EN 2) as illustrated in FIG. 4B. Further, another problem is that when it is desired to set different discharge times respectively for two or more power outputs, two or more FETs are required.

In the invention disclosed in U.S. Pat. No. 6,414,537B, it is difficult to change the discharge time. Furthermore, a discharging transistor and an output voltage controlling transistor can be both simultaneously ON in some states. This causes a problem that a shoot-through current may flow from a power supply terminal toward the ground.

SUMMARY

The present invention has been made in view of the above-described problems, and an object thereof is to provide a semiconductor integrated circuit for discharging and a power supply system that allow control of the off-sequence of two or more power supplies or supply voltages by using a single control signal and facilitate changing the discharge time.

Another object of the present invention is to provide a semiconductor integrated circuit for discharging that can prevent a current supplying pathway from a power supply and a discharging pathway through a discharging element from being both simultaneously active so as to prevent a shoot-through current from flowing.

In order to achieve at least one of the above-described objects, according to an aspect of the present invention, there is provided a semiconductor integrated circuit for discharging, including: a plurality of discharging elements; a plurality of external terminals connected respectively to first terminals of the plurality of discharging elements; and a controlling external terminal that receives from an outside a signal indicating that an operation of an internal circuit is enabled/disabled, wherein in response to the signal received at the controlling external terminal or an output signal of a logic circuit that receives the signal being applied to controlling terminals of the plurality of discharging elements, the discharging semiconductor integrated circuit turns on the plurality of discharging elements to draw charges respectively through the plurality of external terminals.

BRIEF DESCRIPTION OF THE DRAWINGS

The advantages and features provided by one or more embodiments of the invention will become more fully understood from the detailed description given hereinbelow and the appended drawings which are given by way of illustration only, and thus are not intended as a definition of the limits of the present invention.

DETAILED DESCRIPTION OF EMBODIMENTS

Hereinafter, preferred embodiments of the present invention will be described based on the drawings.

Figure 1:
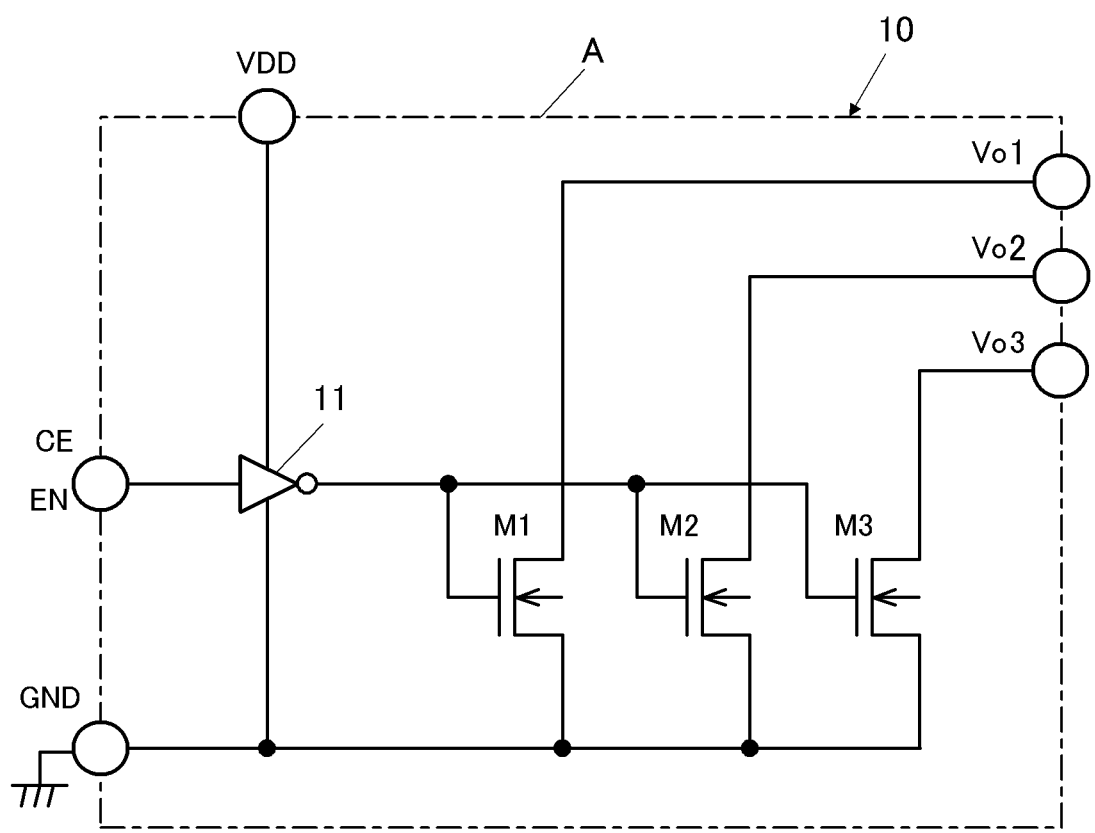
FIG. 1 is a circuit diagram of a semiconductor integrated circuit for discharging according to an embodiment of the present invention.

FIG. 1 illustrates a semiconductor integrated circuit for discharging according to an embodiment of the present invention. In FIG. 1, elements of the circuit surrounded by the dashed dotted line A are formed on a single semiconductor chip as a semiconductor integrated circuit (IC).

The semiconductor integrated circuit for discharging 10 (hereinafter referred to as a discharging IC) of the embodiment includes: a power supply terminal VDD to which a power supply voltage is applied from the outside; a ground terminal GND to which a ground potential is applied; a chip enabling terminal CE to which an enable signal EN indicating that the chip operation (operation of the internal circuit) is enabled/disabled is input; and three output terminals Vo1, Vo2, Vo3. Although not particularly limited, the discharging IC of the embodiment is configured as an low-active IC that turns on discharging elements in the chip to perform a discharge operation when the level of the enable signal EN input to the terminal CE is changed to low. The output terminals Vo1, Vo2, Vo3 function as external terminals to which an element such as a capacitor or an electronic component can be connected at the outside of the chip.

In the chip, three discharging n-channel MOS transistors M1, M2, M3 connected between the output terminals Vo1, Vo2, Vo3 and a ground terminal GND, and an inverter 11 with an input terminal connected to the chip enabling terminal CE are disposed so that on/off of the MOS transistors M1, M2, M3 is controlled by an output signal of the inverter 11.

Specifically, when the level of the enable signal EN is changed to low, the level of the output signal of the inverter 11 is changed to high. Then, the MOS transistors M1, M2, M3 are turned on to function as discharging elements to draw charges from a load, a capacitor or the like connected to the output terminals Vo1, Vo2, Vo3. For this purpose, the element size of the MOS transistors M1, M2, M3 are selected to achieve a necessary discharging rate. Although not particularly limited, the MOS transistors M1, M2, M3 have the same size in this embodiment. Instead of the inverter 11, a Schmitt trigger circuit may be used. This can prevent malfunctions caused by a noise input to the terminal CE.

Next, an example configuration of a system with the above-described discharging IC of the embodiment will be described referring to FIG. 2.

Figure 2A:
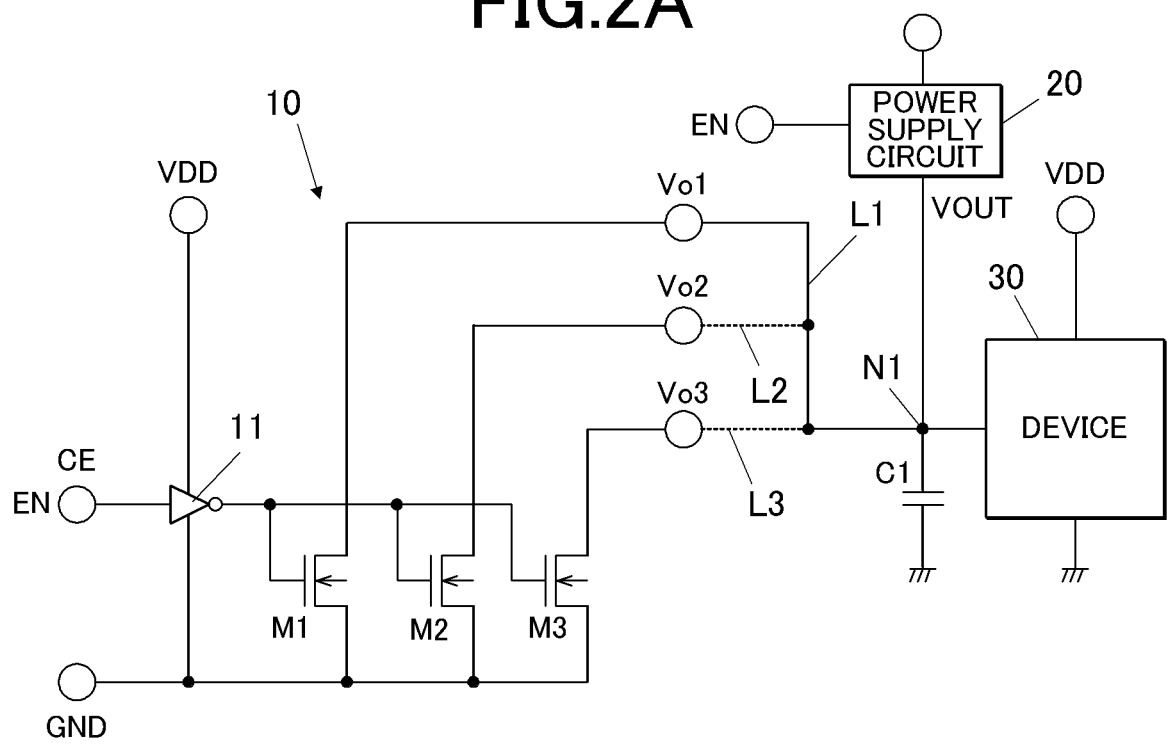
FIG. 2A is a circuit diagram of a system with the semiconductor integrated circuit for discharging in FIG. 1, illustrating an example configuration thereof.

The system in FIG. 2A is a circuit that applies and shuts down a voltage VOUT generated by the power supply circuit 20 to a target device 30. The system is configured such that the output voltage VOUT rapidly falls when the power supply circuit 20 is shut down, so that the target device 30 is prevented from malfunction. The power supply circuit 20 may be constituted by a regulator, a DC/DC converter or any other power supply circuit.

Specifically, a capacitor C1 for stabilizing voltage is disposed at a ground point of the power supply circuit 20 and the target device 30, and an enable signal EN is used as a control signal to turn on/off the power supply circuit 20. As illustrated by the solid line in FIG. 2, a wire L1 is disposed to connect a connection node N1 between the power supply circuit 20 and the capacitor C1 to the output terminal Vo1 of the discharging IC 10 of the above-described embodiment. Thus, the discharging IC 10 can discharge residual charges in the capacitor C1 so that the voltage VOUT applied to the target device 30 rapidly falls when the power supply circuit 20 is turned off.

To decrease the discharging time of the discharging IC, the wires L2, L3 as illustrated by the dashed line in FIG. 2 are further disposed to connect the output terminals Vo2, Vo3 to the connection node N1. To achieve a moderate discharging time, the output terminals Vo1, Vo2 or the output terminals Vo1, Vo3 may be connected to the connection node N1.

In the configuration in FIG. 2A, the signal to be input to the chip enabling terminal CE of the discharging IC 10 is the same enable signal EN as the signal for turning on/off the power supply circuit 20. Accordingly, when the level of the enable signal EN is changed to low so as to turn off the power supply circuit 20 to stop power supply to the objective device 30, the MOS transistor M1 in the discharging IC is immediately turned on and draws residual charges in the capacitor C1 so that the potential of the node N1 rapidly falls.

Figure 2B:
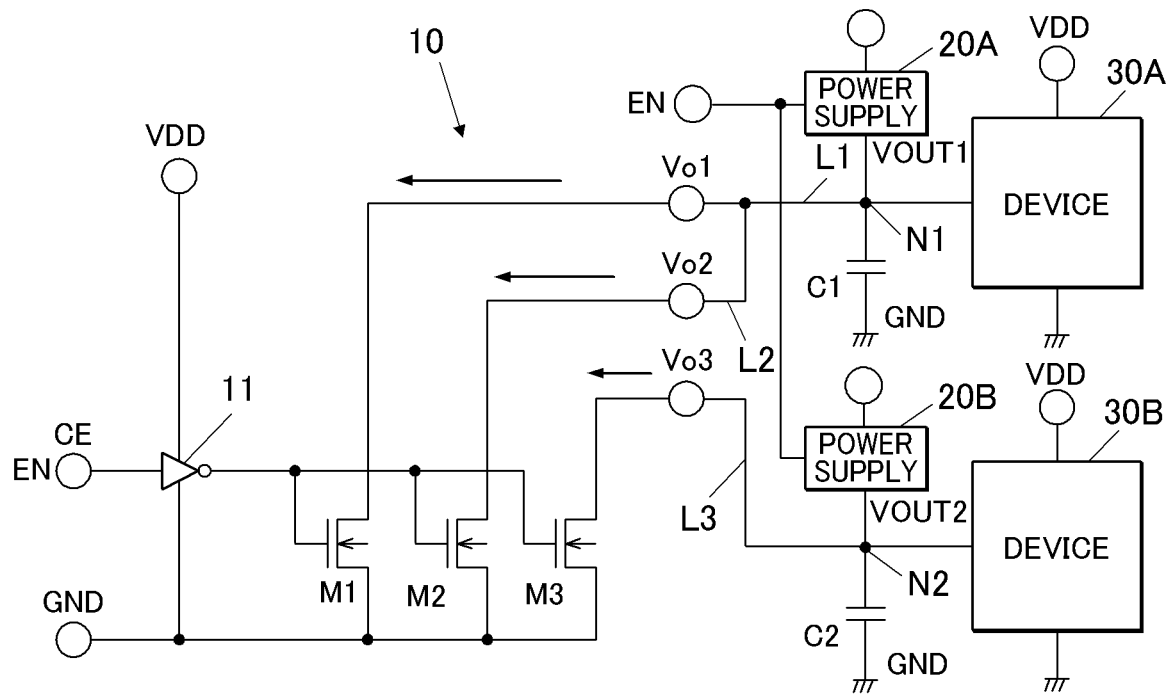
FIG. 2B is a circuit diagram of another system with the semiconductor integrated circuit for discharging in FIG. 1, illustrating an example configuration thereof.

FIG. 2B illustrates an example configuration that includes a target device 30A to which a voltage VOUT 1 generated by a power supply circuit 20A is supplied and a target device 30B to which a voltage VOUT 2 generated by a power supply circuit 20B is supplied. This configuration is intended to prevent the target devices 30A, 30B from malfunctions by making the voltages VOUT1, VOUT 2 rapidly fall as well as making the VOUT 1 fall prior to the VOUT 2 when the power supply circuits 20A, 20B are shut down.

In the circuit in FIG. 2B, the output terminals Vo1, Vo2 of the discharging IC 10 of the above-described embodiment are connected to a node N1 as illustrated by the solid lines L1, L2. Further, the output terminal Vo3 of the discharging IC is connected to a connection node N2 as illustrated by the solid line L3.

With this configuration, the discharging IC can discharge residual charges in capacitors C1, C2 so that the voltages VOUT 1, VOUT2 supplied to the target devices 30A, 30B rapidly fall and that the VOUT 1 falls prior to the VOUT2 when the power supply circuits 20A, 20B are turned off.

Specifically, a capacitor C1 is disposed between the power supply circuit 20A and the ground point, and a capacitor C2 is disposed between the power supply circuit 20B and the ground point. In FIG. 2B, the enable signal EN is used to turn on/off the power supply circuits 20A, 20B. Instead, another independent enable signal may be used to turn on/off the power supply circuits 20A, 20B.

Figure 3A:
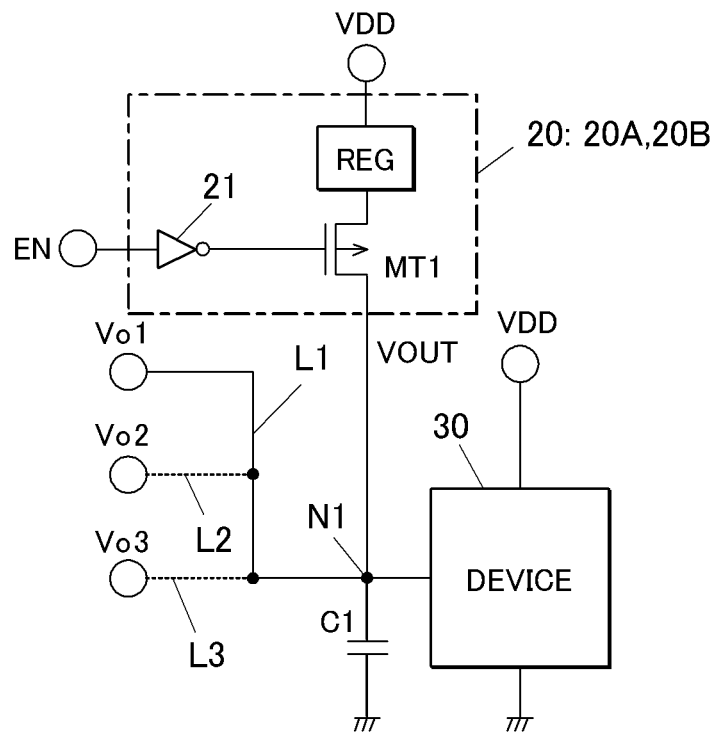
FIG. 3A and FIG. 3B are circuit diagrams of specific examples of the power supply circuits in FIG. 2A and FIG. 2B.

Specifically, as illustrated in FIG. 3A, each of the power supply circuit 20 in FIG. 2A and the power supply circuits 20A, 20B in FIG. 2B may be constituted by a regulator REG, a switching MOS transistor MT1 for controlling supply/cutoff of a voltage VOUT generated by the regulator, and an inverter 21 that receives the enable signal EN to generate a signal for controlling a gate terminal of the transistor MT1.

Figure 3B:
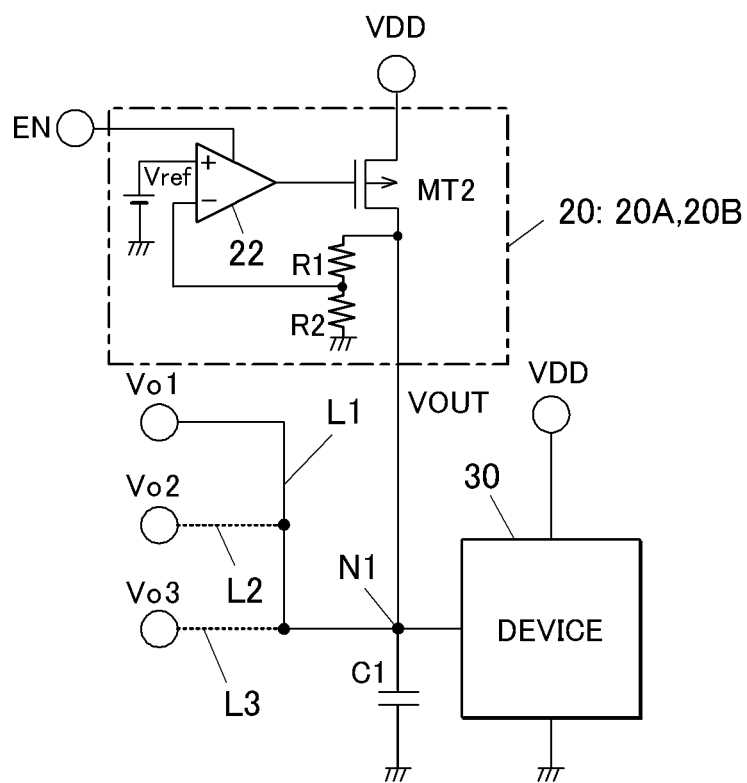

Alternatively, as illustrated in FIG. 3B, each of the power supply circuits 20A, 20B may be constituted by a simple regulator that includes a differential amplifier 22 for controlling a gate terminal of a MOS transistor MT2, resistors R1, R2 for dividing a drain voltage of the transistor MT2, and a reference voltage Vref, which applies a voltage divided by the resistors R1, R2 to a reverse input terminal of the differential amplifier 22 to generate and supply a voltage proportional to the reference voltage Vref as the output voltage VOUT. Also in this circuit, it is possible to cut off the output voltage VOUT by turning off the differential amplifier 22 with the enable signal EN. Furthermore, this circuit does not require a switching MOS transistor MT1.

Figure 4A:
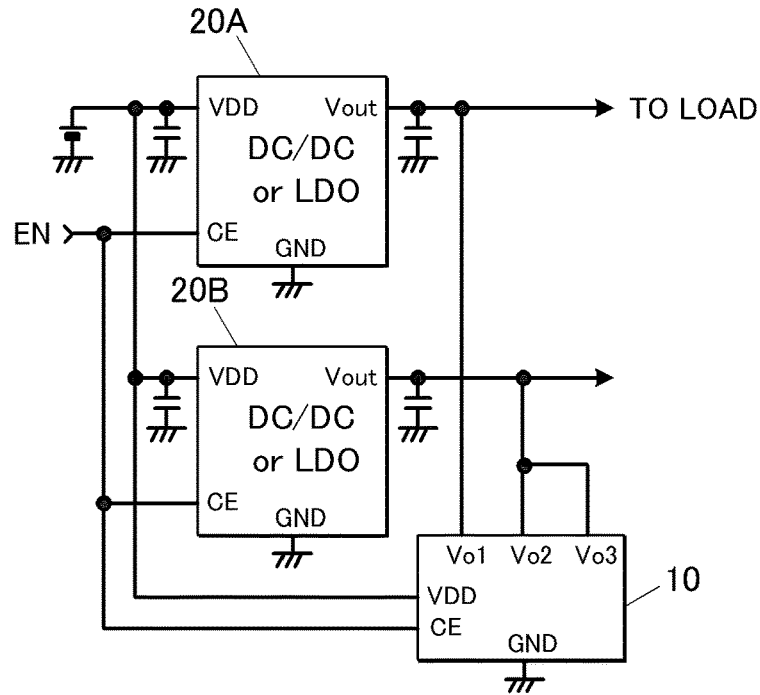
FIG. 4A is a circuit diagram of a power supply system with the semiconductor integrated circuit for discharging in FIG. 1, illustrating an example configuration thereof.

FIG. 4A illustrates an example configuration of a power supply system to which the discharging IC of the above-described embodiment is applied.

Specifically, the output terminal Vo1 of the discharging IC 10 of the above-described embodiment is connected to an output terminal Vout of a first power supply device (DC/DC converter or regulator LDO) 20A, and the output terminals Vo2, Vo3 of the discharging IC 10 of the above-described embodiment are connected to an output terminal Vout of a second power supply device 20B.

The enable signal EN for the discharging IC 10 is commonly used to turn on/off the power supply devices 20A, 20B.

When the two power supply devices 20A, 20B are turned off by using the enable signal EN, the power supply system in FIG. 4A can make the output voltages VoutA, VoutB rapidly fall by discharging charges in capacitors C1, C2 that are connected to the output terminals Vout of the power supply devices 20A, 20B for stabilizing the output voltages. Furthermore, the power supply system in FIG. 4A can make the output voltage VoutB fall prior to the output voltage VoutA since the two output terminals Vo2, Vo3 of the discharging IC 10 are connected to the output terminal Vout of the power supply device 20B.

Figure 4B:
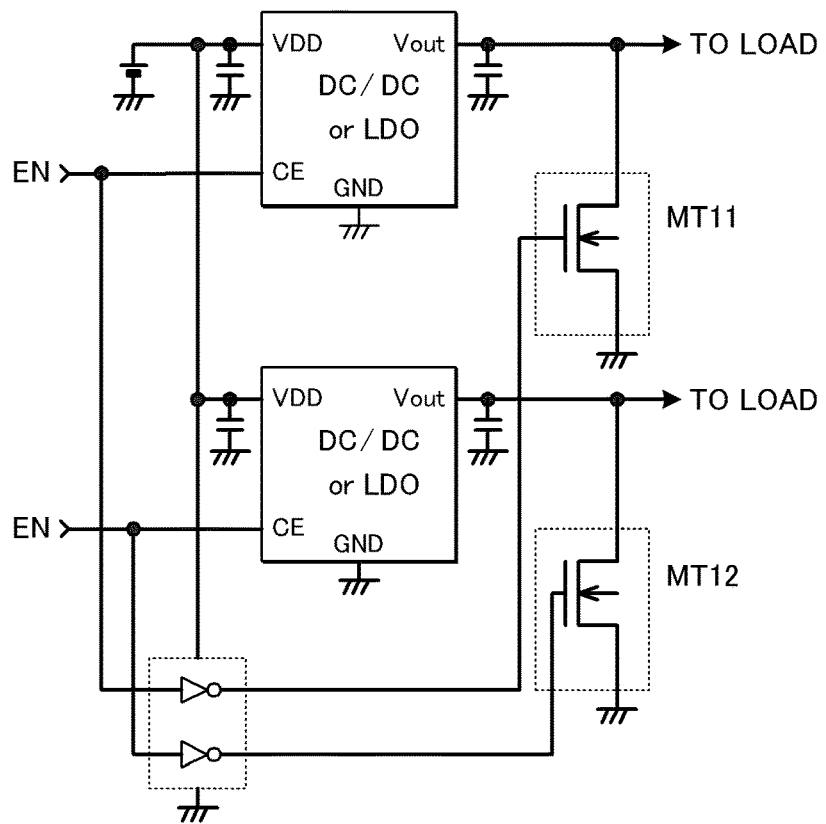
FIG. 4B is a circuit diagram of a conventional power supply system in which a discharging circuit is constituted by discreet components, illustrating an example configuration thereof.

In conventional power supply systems having a similar function, for example, a discharging circuit as illustrated in FIG. 4B is constituted by discreet components (inverters, FETs or the like). As can be seen by comparing FIG. 4A with FIG. 4B, the power supply system in FIG. 4A requires a smaller number of parts. Further, while the conventional system in FIG. 4B requires discharging MOS transistors M11, M12 with different sizes, the power supply system in FIG. 4A only requires the single discharging IC 10. This is advantageous in parts control.

Variation 1

The discharging IC 10 of the above-described embodiment is designed such that the discharging MOS transistors M1, M2, M3 have the same size. Instead, the discharging IC 10 may be designed such that the discharging MOS transistors M1, M2, M3 have a specific ratio in size of such as 1:2:3.

Figure 5:
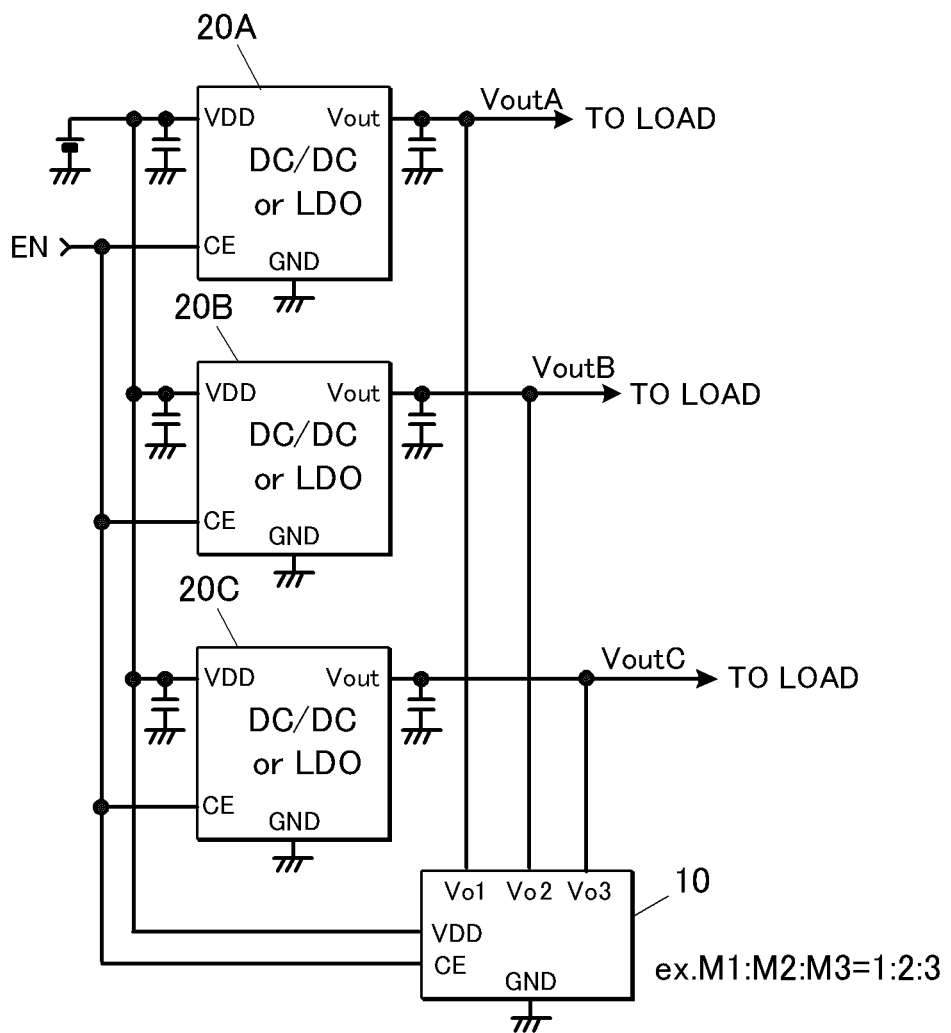
FIG. 5 is a circuit diagram of a power supply system with a first variation of the semiconductor integrated circuit for discharging that includes discharging elements with different sizes (M1<M2<M3), illustrating an example configuration thereof.

When the discharging IC 10 thus designed is used to produce a power supply system as illustrated in FIG. 5, it can make output voltages VoutA, VoutB, VoutC of power supplies (regulators) 20A, 20B, 20C fall in the order of VoutC, VoutB and VoutA.

Variation 2

Figure 6:
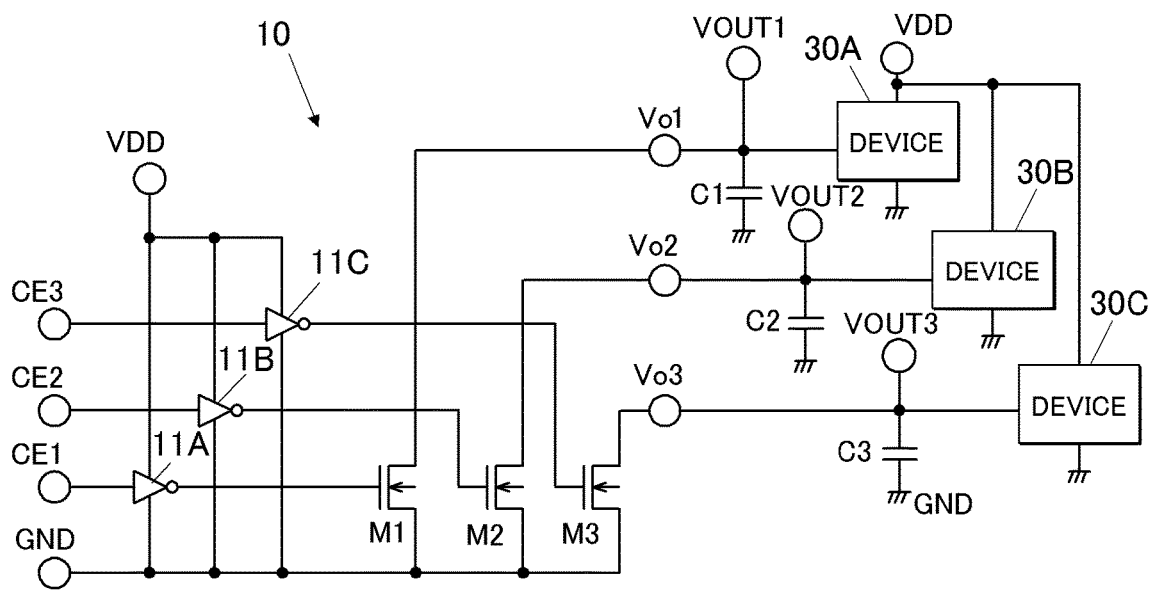
FIG. 6 is a circuit diagram of a second variation of the semiconductor integrated circuit for discharging according to the embodiment in FIG. 1 and a voltage supplying system with this semiconductor integrated circuit for discharging, illustrating an example configuration thereof.

FIG. 6 illustrates a second variation of the discharging IC 10 of the above-described embodiment.

The variation in FIG. 6 includes chip enabling terminals CE1, CE2, CE3 and inverters 11A, 11B, 11C corresponding respectively to discharging MOS transistors M1, M2 and M3. With this configuration, it is possible to freely set the discharging order of the transistors M1, M2, M3 by controlling the timing of enable signals EN 1, EN 2, EN 3 to be input respectively at the chip enabling terminals CE1, CE2, CE3 with a system controller such as an external microcomputer.

Second Embodiment

Figure 7:
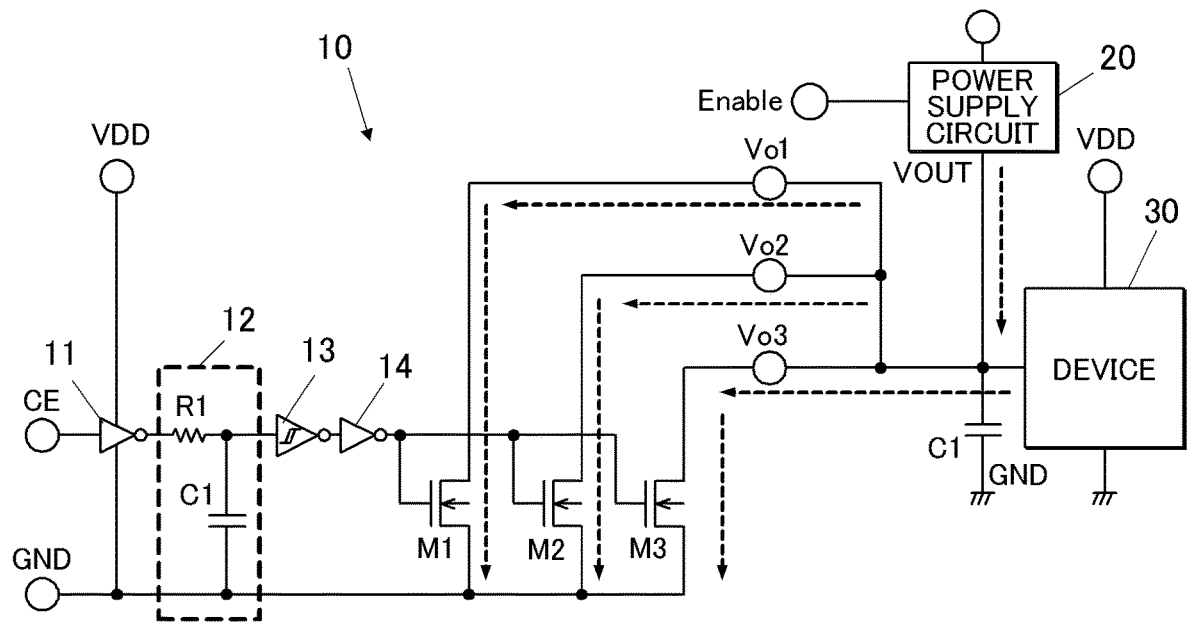
FIG. 7 is a circuit diagram of a semiconductor integrated circuit for discharging according to a second embodiment of the present invention.

FIG. 7 illustrates the configuration of a discharging IC 10 according to a second embodiment and a system as an application thereof.

As illustrated in FIG. 7, a discharging IC 10 of this embodiment includes a delay circuit 12 composed of a resistor R1 and a capacitor C1, a second inverter 13, and a third inverter 14, which are disposed between an inverter 11 for inverting an enable signal EN and gate terminals of discharging MOS transistors M1, M2, M3. The second inverter 13 may be replaced with a Schmitt trigger circuit or a comparator so that a noise or the like input to the delay circuit 12 does not fluctuate the input signal at the inverter and destabilize the operation of the discharging MOS transistors M1, M2, M3. Further, the second inverter 14, which is provided to convert the logic, can be omitted when the power supply circuit (IC) is configured to be on when the enable signal EN for controlling the power supply circuit is low (e.g. configuration without an inverter IVN1).

In the system in FIG. 2, which has the same function as the system in FIG. 7, the power supply circuit 20 and the discharging MOS transistors M1 to M3 are mutually complementary turned on/off. However, while switching between on and off, the power supply circuit 20 and the discharging MOS transistors M1 to M3 may sometimes be both simultaneously on for a moment. This causes flow of a shoot-through current.

In contrast, since the system in FIG. 7 is provided with the delay circuit 12, it can firstly turn off the switching MOS transistor MT1 and thereafter turn on the discharging MOS transistors M1 to M3. This is advantageous in reliably preventing a shoot-through current from flowing through the switching MOS transistor MT1 and the discharging MOS transistors M1 to M3.

Third Embodiment

FIG. 8 illustrates a discharging IC 10 according to a third embodiment.

The discharging IC 10 of the embodiment further includes second and third ground terminals GND1, GND 2 in addition to a ground terminal GND0 that provides a ground potential to an inverter 11 for inverting an enable signal EN, and the ground terminals GND1, GND2 are connected to source terminals of discharging MOS transistors M1, M2.

Figure 8A:
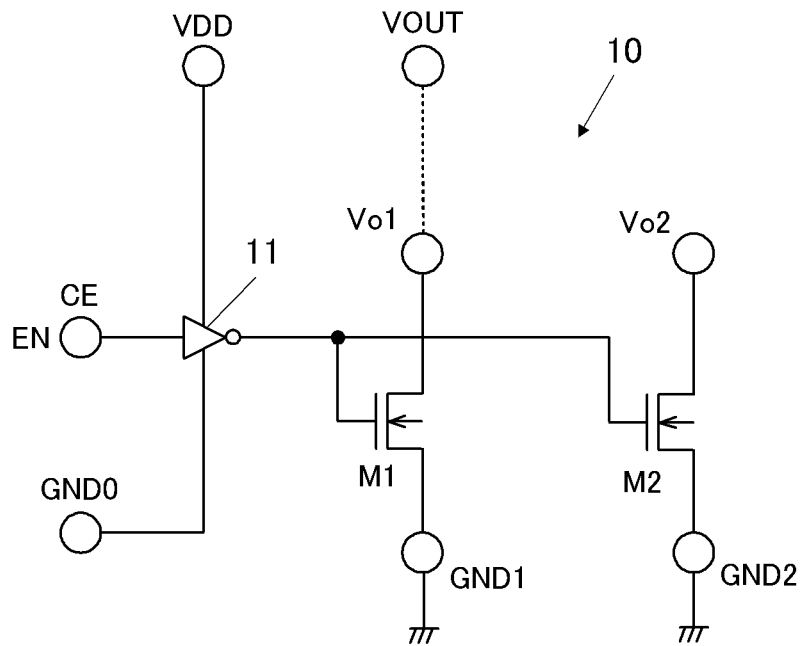
FIG. 8A is a circuit diagram of a semiconductor integrated circuit for discharging according to a third embodiment of the present invention.

The discharging IC having this configuration can separately discharge charges in capacitors or loads connected respectively to output terminals Vo1, Vo2 since the ground potential is applied to the ground terminals GND1, GND2 as illustrated in FIG. 8A.

Figure 8B:
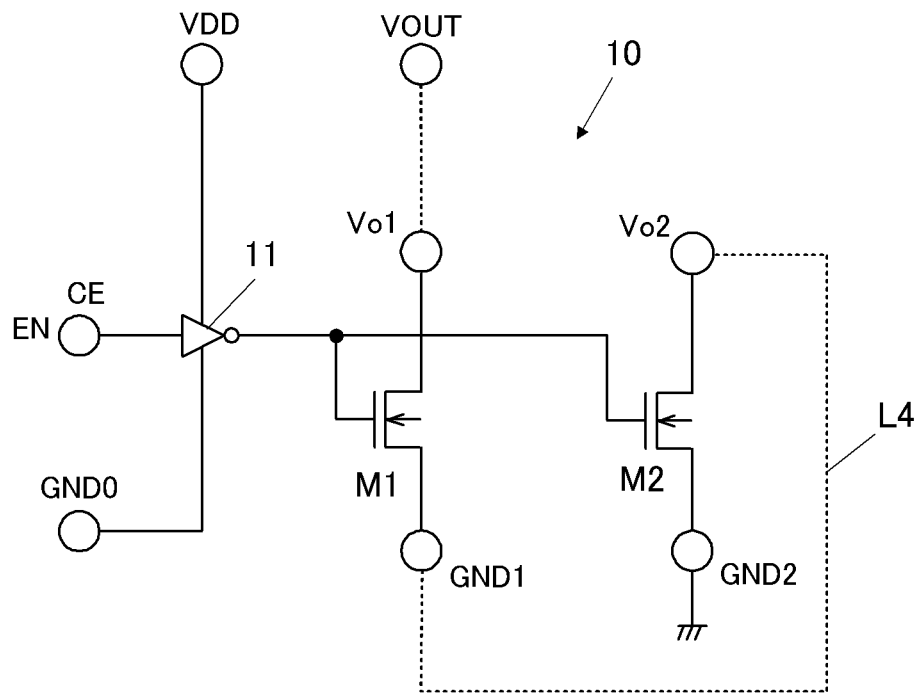
FIG. 8B is a circuit diagram of an example application thereof.

Further, by connecting the output terminal Vo2 to the ground terminal GND 1 with a wire L4 as illustrated by the dashed line in FIG. 8B, it is possible to serially connect the MOS transistors M1, M2 to increase the on-resistance so as to increase the discharging time compared to the IC in FIG. 8A.

The wire L4 in FIG. 8B may be constituted by an aluminum wire disposed in the chip.

While the invention made by the present inventors is specifically described with some embodiments, the present invention is not limited to the embodiments. For example, the discharging ICs of the embodiments include two or three discharging MOS transistors. However, the number of transistors is not limited to two or three, and the discharging IC of the present invention may include four or more transistors.

In the embodiments, the enable signal EN is input to the chip enabling terminal CE, and the inverter receives the enable signal and supplies it to the gate terminals of the discharging MOS transistors M1, M2, M3. Instead of the inverter, the discharging IC may be configured such that a logic circuit such as an OR gate receives the enable signal EN. Further, while the above-described embodiments are ICs specifically for discharging, the present invention is also applicable as a part of an IC having a different function such as regulator controlling function.

According to an aspect of the present disclosure, there is provided a semiconductor integrated circuit for discharging, including: a plurality of discharging elements; a plurality of external terminals connected respectively to first terminals of the plurality of discharging elements; and a controlling external terminal that receives from an outside a signal indicating that an operation of an internal circuit is enabled/disabled, wherein in response to the signal received at the controlling external terminal or an output signal of a logic circuit that receives the signal being applied to controlling terminals of the plurality of discharging elements, the discharging semiconductor integrated circuit turns on the plurality of discharging elements to draw charges respectively through the plurality of external terminals.

With the above-described configuration, it is possible to suitably set the magnitude of a drawing current by selecting whether to independently use each of the discharging elements or to connect the discharging elements in series. This allows control of the off-sequence of two or more power supplies or supply voltages by using a single control signal as well as readily changing the discharging time.

Preferably, second terminals of the plurality of discharging elements are connected to a common external ground terminal.

This can reduce the number of external terminals of the chip.

Alternatively, the semiconductor integrated circuit for discharging according further includes a plurality of external terminals respectively connected to second terminals of the plurality of discharging elements.

With this configuration, it is possible to suitably set the magnitude of a drawing current by selecting whether to independently use each of the discharging elements or to connect the discharging elements in series. This allows control of the off-sequence of two or more power supplies or supply voltages by using a single control signal as well as readily changing the discharging time.

Preferably, the controlling external terminal includes a plurality of controlling external terminals that correspond respectively to the controlling terminals of the discharging elements.

With this configuration, it is possible to input an external signal to the plurality of controlling terminals at different timings so as to perform discharging at different timings. This allows control of the off-sequence of power supplies or supply voltages and readily changing the discharge time.

It is preferred that the semiconductor integrated circuit for discharging further includes: a delay circuit that delays a signal received at the controlling external terminal; and a Schmitt trigger circuit that receives as an input signal a signal delayed by the delay circuit.

When the semiconductor integrated circuit for discharging is applied to a system in which a switching element is connected between an external power supply voltage terminal and the output terminal of the semiconductor integrated circuit for discharging, this configuration can prevent the switching element and the discharging element in the chip from being simultaneously turned on by the same control signal and thereby prevent a shoot-through current from flowing. Further, the Schmitt trigger circuit disposed after the delay circuit can prevent the operation of the discharging element from being instable by a noise or the like input to the delay circuit.

According to another aspect of the present disclosure, there is provided a power supply system, including: the semiconductor integrated circuit for discharging as described above; and a plurality of power supply devices, wherein an output terminal of one of the plurality of power supply devices is connected to one of the plurality of external terminals of the semiconductor integrated circuit for discharging, and wherein an output terminal of a remainder of the plurality of power supply devices is connected to two or more of the plurality of external terminals of the semiconductor integrated circuit for discharging except for the one of the external terminals.

The power supply system having this configuration can discharge charges at an output terminal of a power supply device that is connected to two or more external terminals prior to charges at an output terminal of a power supply device that is connected to a single external terminal. This allows control of the off-sequence as well as readily changing the discharge time by changing the number of external terminals of the semiconductor integrated circuit for discharging that are connected to the output terminals of the power supply devices.

With the semiconductor integrated circuit for discharging of the present disclosure, it is possible to control an off-sequence of two or more power supplies or supply voltages by using a single control signal and to readily change the discharge time. Furthermore, it is possible to prevent a current supplying pathway from a power supply and a discharging pathway through a discharging element from being simultaneously active and to thereby prevent a shoot-through current from flowing.

What is claimed is:

1. A semiconductor integrated circuit for discharging, comprising:
    first, second, and third discharging elements;
    first, second, and third first-type external terminals connected respectively to first terminals of the first, second, and third discharging elements; and
    a single controlling external terminal that receives, from outside of the semiconductor integrated circuit, a signal that turns ON/OFF the first, second, and third discharging elements,
    wherein, in response to the signal received at the controlling external terminal or an output signal of a logic circuit that receives the signal being applied to controlling terminals of the first, second, and third discharging elements, the discharging semiconductor integrated circuit turns on the first, second, and third discharging elements to draw charges respectively through the first, second, and third first-type external terminals, and
    wherein the first, second, and third discharging elements are controlled by a same signal.

2. The semiconductor integrated circuit for discharging according to claim 1, wherein second terminals of the first, second, and third discharging elements are connected to a common second-type external terminal.

3. The semiconductor integrated circuit for discharging according to claim 1, further comprising:

first, second, and third second-type external terminals respectively connected to second terminals of the first, second, and third discharging elements.

4. The semiconductor integrated circuit for discharging according to claim 1, further comprising:
a delay circuit that delays a signal received at the controlling external terminal,
wherein a signal delayed by the delay circuit is input to the controlling external terminal.

5. A power supply system, comprising:
the semiconductor integrated circuit for discharging according to claim 1; and
first and second power supply devices,
wherein an output terminal of the first power supply device is connected to the first first-type external terminal of the semiconductor integrated circuit for discharging, and
wherein an output terminal of the second power supply device is connected to the second and third first-type external terminals of the semiconductor integrated circuit for discharging.

6. A semiconductor integrated circuit for discharging, comprising:
first, second, and third discharging elements;
first, second, and third first-type external terminals connected respectively to first terminals of the first, second, and third discharging elements; and
first, second, and third controlling external terminals that respectively receive, from outside of the semiconductor integrated circuit, signals that respectively turn ON/OFF the first, second, and third discharging elements,
wherein, in response to the signals received at the controlling external terminals or output signals of logic circuits that receive the signals being applied to controlling terminals of the first, second and third discharging elements, the discharging semiconductor integrated circuit turns on the first, second and third discharging elements to draw charges respectively through the first, second and third first-type external terminals.

7. The semiconductor integrated circuit for discharging according to claim 6, wherein second terminals of the first, second, and third discharging elements are connected to a common second-type external terminal.

8. The semiconductor integrated circuit for discharging according to claim 6, further comprising:
first, second, and third second-type external terminals respectively connected to second terminals of the first, second, and third discharging elements.

9. A power supply system, comprising:
the semiconductor integrated circuit for discharging according to claim 6; and
first and second power supply devices,
wherein an output terminal of the first power supply device is connected to the first first-type external terminal of the semiconductor integrated circuit for discharging, and wherein an output terminal of the second power supply device is connected to the second and third first-type external terminals of the semiconductor integrated circuit for discharging.

* * * * *